United States Patent
Kruijswijk et al.

(10) Patent No.: US 7,297,911 B2
(45) Date of Patent: Nov. 20, 2007

(54) LITHOGRAPHIC APPARATUS, ILLUMINATION SYSTEM, ILLUMINATION CONTROLLER AND CONTROL METHOD

(75) Inventors: Stefan Geerte Kruijswijk, Eindhoven (NL); Johannes Heintze, Eindhoven (NL); Paul Van Der Veen, Waalre (NL)

(73) Assignee: ASML Netherlands B.V., Veldhoven (NL)

(*) Notice: Subject to any disclaimer, the term of this patent is extended or adjusted under 35 U.S.C. 154(b) by 122 days.

(21) Appl. No.: 11/184,066

(22) Filed: Jul. 19, 2005

(65) Prior Publication Data

US 2007/0018071 A1    Jan. 25, 2007

(51) Int. Cl.
G03B 27/52 (2006.01)

(52) U.S. Cl. .................... 250/205; 355/55; 355/69; 250/548

(58) Field of Classification Search ............ 355/67, 355/53, 57, 55, 30, 77; 250/548, 492.1, 492.2, 250/205
See application file for complete search history.

(56) References Cited

U.S. PATENT DOCUMENTS 6,538,723 B2 * 3/2003 Hagiwara ................ 355/67
2003/0103196 A1 * 6/2003 Hirukawa ................ 355/55
2004/0021840 A1 * 2/2004 Heintze .................... 355/30
2005/0264777 A1 * 12/2005 Gardner ................... 355/53
2006/0055908 A1 * 3/2006 Urban et al. .............. 355/69

* cited by examiner

Primary Examiner—Thanh X. Luu
Assistant Examiner—Tony Ko
(74) Attorney, Agent, or Firm—Pillsbury Winthrop Shaw Pittman LLP (57) ABSTRACT

A lithographic apparatus includes an illumination system configured to condition a radiation beam. The illumination system includes a pulsed source of radiation and a controller to control an output of the pulsed source of radiation. The controller includes a dose sensor to measure a dose of a pulse of the source of radiation. The dose sensor includes a dose sensor output to provide a dose signal representative of the measured dose. An integrator unit is connected to the dose sensor output. The integrator unit integrates the dose signal at least twice, an output of the integrator unit provides an integrator output signal including the at least twice integrated dose signal. The output of the integrator unit drives a driving input of the source of radiation with the integrator output signal.

15 Claims, 4 Drawing Sheets

LITHOGRAPHIC APPARATUS, ILLUMINATION SYSTEM, ILLUMINATION CONTROLLER AND CONTROL METHOD

BACKGROUND

1. Field of the Invention

The present invention relates to a lithographic apparatus, an illumination system, a controller and method to control an output of a pulsed source of radiation.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, as well as in many other applications, a surface such as a substrate surface or a wafer surface is to be illuminated by a pulsed source of radiation. The pulsed source of radiation, such as a pulsed laser, provides for a series of pulses, e.g., at a certain pulse repetition rate. During an illumination, the substrate or other object, which is to be illuminated, is moved such that with each pulse a different part of the surface of the substrate or other object is illuminated. Commonly, surfaces which are illuminated by subsequent pulses will show a certain amount of overlap. Thus, each location of the surface of the substrate which is to be illuminated is generally provided with optical radiation from at least two pulses. Commonly, a relation between the pulse repetition frequency, a size of a window of the substrate or other surface which is to be illuminated, and a scanning speed of the substrate or other to be illuminated object, is chosen such that each point of the surface of the substrate or other to be illuminated surface is illuminated by a plurality of pulses. Due to physical constraints, pulse energy of the pulsed source of radiation may show a certain amount of deviation. In other words, an energy provided by subsequent pulses may differ to a certain extent. Commonly, however, it is desirable to provide a homogeneous illumination, i.e., to arrange that each point on the surface of the substrate or other to be illuminated object, is provided with a substantially same dose of radiation. For this reason, a controller may be provided which drives the pulsed source of radiation thereby making use of a pulse energy of the source of radiation at previous pulses. To accomplish this, the controller may comprise a feed back loop incorporating an integrator. By the integrator, a total dose of pulses of radiation at a certain location may be stabilized to a certain extent by the integrative action of the controller, which may easily be understood as subsequent pulses illuminating a certain point at the surface of the substrate or other object will add to form a total dose at that point.

In more detail, a standard deviation SD of the integrated dose at any point of the wafer when the laser is controlled by the above described controller may be expressed as:

$$SD\,(\text{output}) = \frac{SD\,(\text{laser})}{N\sqrt{(n/2)}}$$

wherein SD (output) represents a standard deviation of the output of the laser when in the control loop, SD (laser) represents a standard deviation of the pulsed source of radiation as is, thus without the controller, and N represents a number of laser pulses in a slit which is used to create a window of illumination onto the substrate or other surface, and n represents a number of pulses in a slope of the slit profile. Thus, it can be easily seen that a standard deviation of the output may be reduced by reducing the standard deviation of the laser as well as by increasing the number of pulses in a slit, e.g., by increasing a pulse repetition frequency or by decreasing a scanning speed with which the substrate or other object is scanned.

The principle of controlling as described above has been used for a long time in many applications. In fact, it is believed by the person skilled in the art that an improvement to the controller as described above may be difficult.

SUMMARY

It is desirable to enhance a performance of the pulsed radiation source control.

According to an embodiment of the invention there is provided a lithographic apparatus comprising:

an illumination system configured to condition a radiation beam, the illumination system comprising a pulsed source of radiation and a controller to control an output of the pulsed source of radiation, the controller comprising a dose sensor to measure a dose of a pulse of the source of radiation, the dose sensor to provide a dose signal representative of the measured dose, and an integrator unit to at least twice integrate the dose signal, an output of the integrator unit to provide an integrator output signal comprising the at least twice integrated dose signal, the output of the integrator unit to drive a driving input of the source of radiation with the integrator output signal.

In another embodiment of the invention, there is provided an illumination system configured to condition a radiation beam, the illumination system comprising a pulsed source of radiation and a controller to control an output of the pulsed source of radiation, the controller comprising a dose sensor to measure a dose of a pulse of the source of radiation, the dose sensor to provide a dose signal representative of the measured dose, and an integrator unit to at least twice integrate the dose signal, an output of the integrator unit to provide an integrator output signal comprising the at least twice integrated dose signal, the output of the integrator unit to drive a driving input of the source of radiation with the integrator output signal.

According to a further embodiment of the invention, there is provided a controller to control an output of a pulsed source of radiation, the controller comprising a dose sensor to measure a dose of a pulse of the source of radiation, the dose sensor to provide a dose signal representative of the measured dose, and an integrator unit to at least twice integrate the dose signal, an output of the integrator unit to provide an integrator output signal comprising the at least twice integrated dose signal, the output of the integrator unit to drive a driving input of the source of radiation with the integrator output signal.

According to a still further embodiment of the invention, there is provided a method to control an output of a pulsed source of radiation, the method comprising measuring a dose of a pulse of the source of radiation, at least twice integrating the measured dose to provide an integrator output signal comprising an at least twice integrated dose signal, and drive a driving input of the source of radiation with the integrator output signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
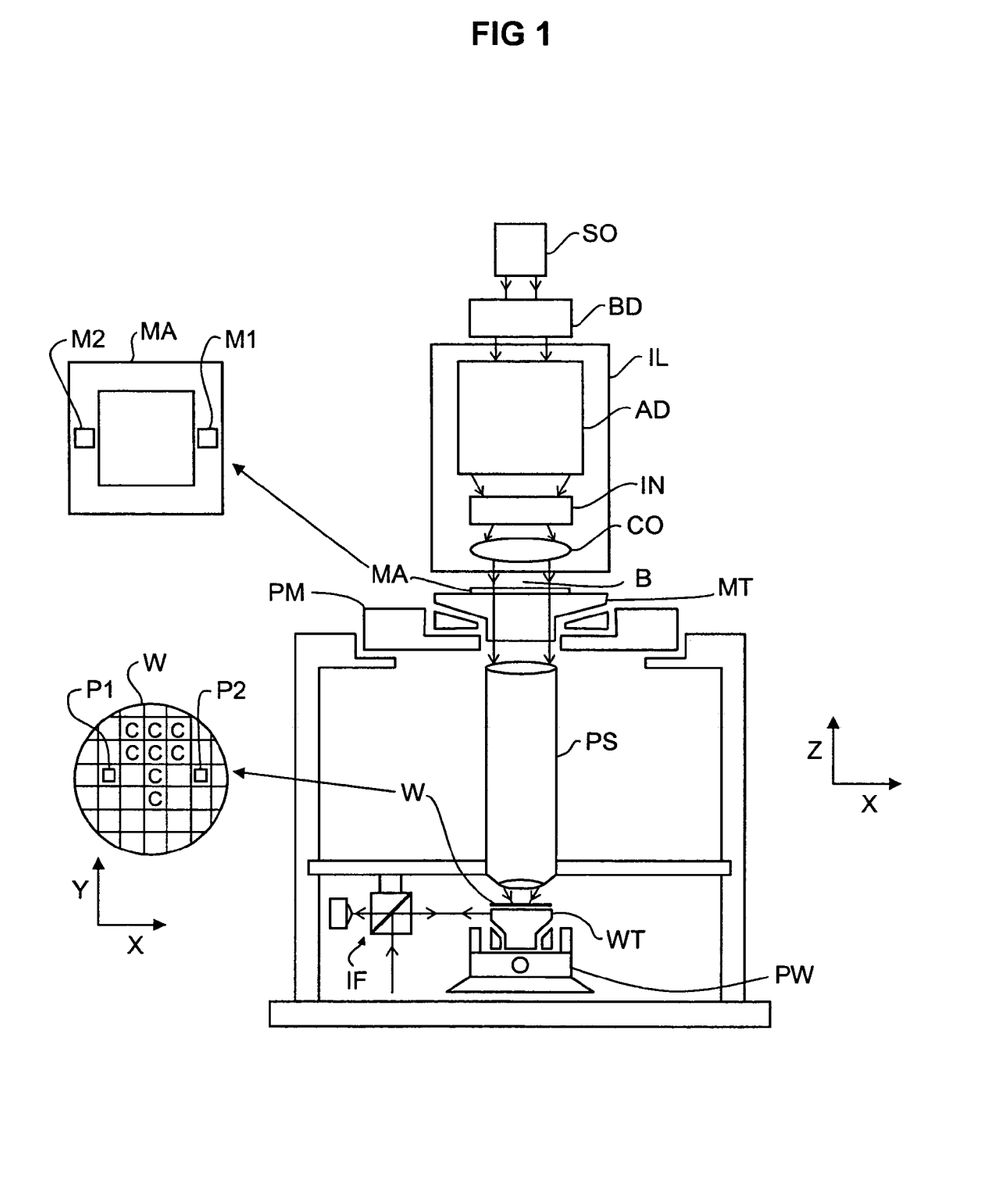
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2A:
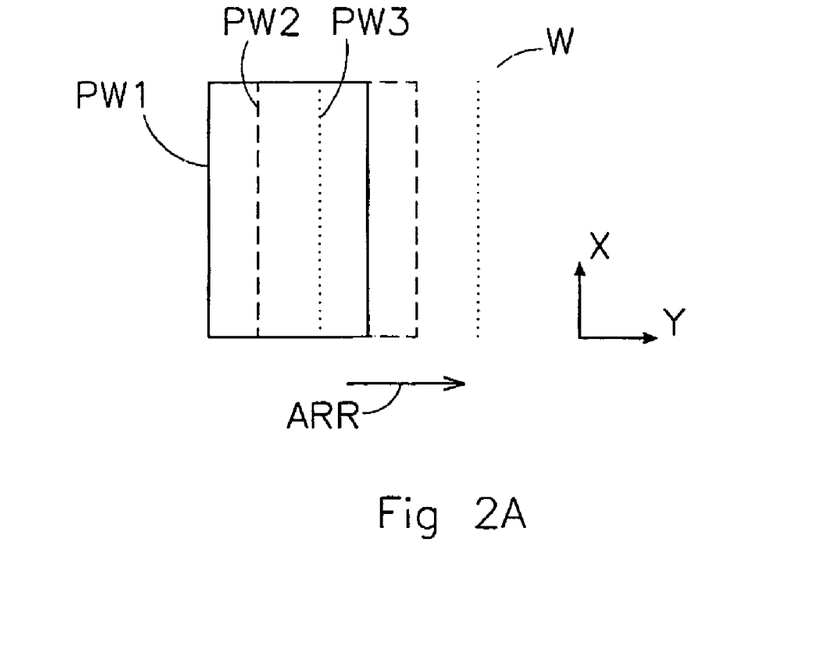
FIG. 2a-2b schematically depict a shape of a pulse window and an intensity profile of one or more pulses provided by the pulsed source of radiation in accordance with an embodiment of the invention.

FIG. 2a schematically depicts a top view of a part of a surface of a substrate W or other surface of an object which is to be illuminated, and shows a shape of consecutive pulses indicated by pulse window PW1, pulse window PW2 and pulse window PW3. A direction of scanning is indicated by arrow ARR. The scanning may be performed by moving the substrate W or other object with respect to the pulsed source of radiation, by a suitable manipulation in an optical protection system such as the projection system PS indicated in FIG. 1, or by, for example, moving the pulsed source of radiation with respect to the substrate W. As scanning is performed in the direction indicated by arrow ARR, a first pulse illuminates, for example, window PW1, a second pulse illuminates window PW2, a third pulse illuminates window PW3. As shown in FIG. 2a, the window PW1, PW2, PW3 show a certain amount of overlap. In a practical implementation, more or less overlap may be present, it is, e.g., imaginable that in embodiments of a lithographic apparatus that tens of pulses overlap each other, e.g., 20, 40, 60 or 80 pulses. In the schematic representation shown in FIG. 2a, an overlap of three pulses is depicted.

Figure 2B:
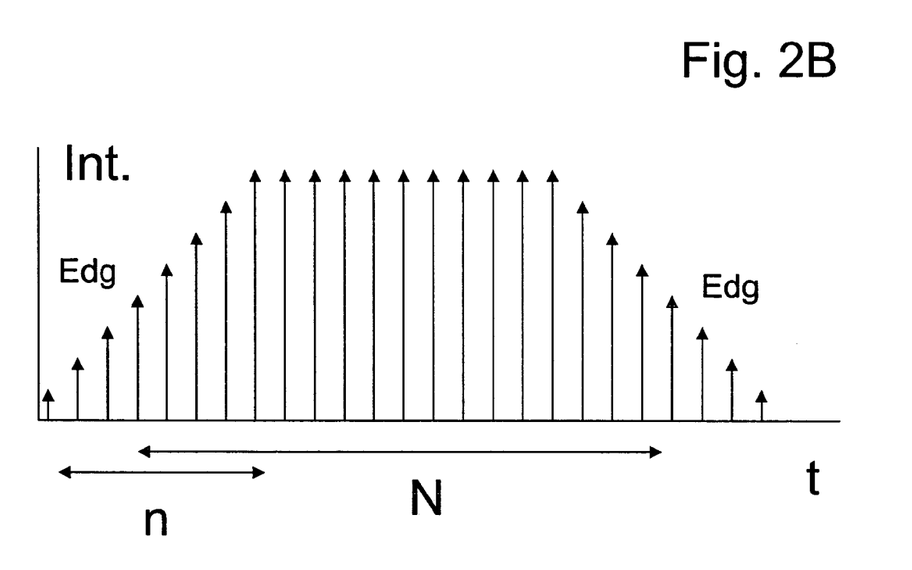

Although in FIG. 2a the pulse windows PW1, PW2, PW3 are shown to have a rectangular shape, any shape may be possible, such as a circular, oval, triangular, square or any other shape. An intensity of subsequent pulses on a location on the substrate is depicted in FIG. 2b. FIG. 2b shows along a horizontal axis a time, i.e., subsequent pulses are depicted. A vertical axis in the graph in FIG. 2b shows an intensity of the subsequent pulses as measured on a single location on the substrate. It is remarked that the example as shown in FIG. 2b comprises a substantially larger overlap as compared to the example according to FIG. 2a. In other words, a single location on the substrate is illuminated by a larger number of pulses during the scanning. As depicted in FIG. 2b, in a mid-region, the pulses show a relatively uniform amount of energy (an amount of pulses in this region commonly being indicated as N), while near the edges Edg, a slope may be observed (an amount of pulses in this region commonly being indicated as n). It is noted that the number N may be understood as comprising the number of pulses at a location which have an intensity at that location of 50% or more of the intensity of pulses in the mid region at that location. Thus, at the edges EDG, an intensity of the pulse gradually changes from its value in the mid-region towards zero. Commonly, the pulse window PW1, PW2, PW3 may have been formed by a slit which may be positioned, e.g., in the patterning device such as the mask MA. Due to, e.g., physical effects such as diffraction, the slope may come into existence.

Referring to FIG. 1, the pulsed source of radiation may as an example be comprised in the source SO. Further detail of the illumination system will now be described with reference to FIGS. 3 and 4a-e.

Figure 3:
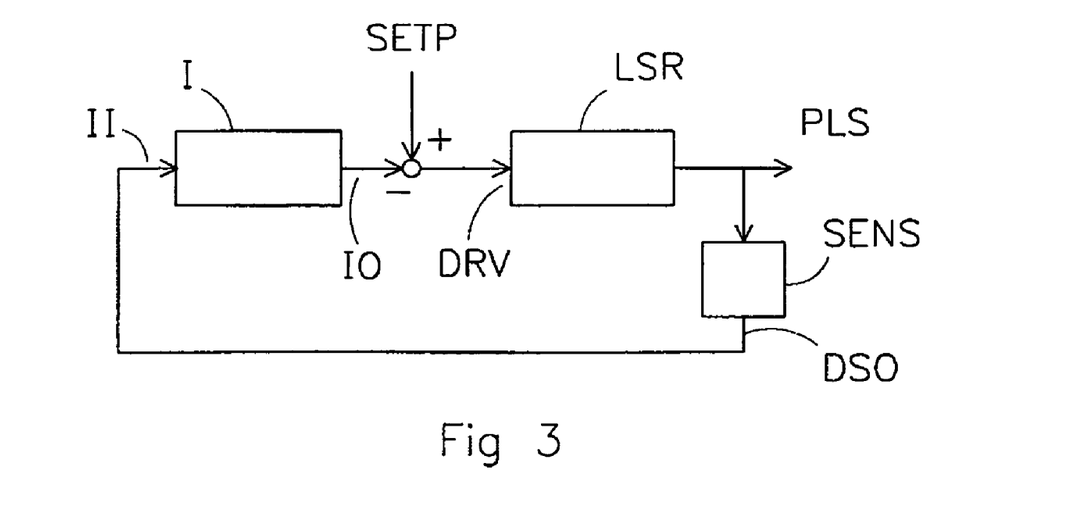
FIG. 3 schematically depicts a control diagram showing the pulsed source of radiation and the controller in accordance with an embodiment of the invention.

FIG. 3 shows a pulsed source of radiation in this example a pulsed laser LSR. The pulsed source of radiation may however also comprise any other type of radiation source, such as, for example, a light emitting diode (LED), a diode laser, a laser including a conversion system, such as a RAMAN conversion, a gas discharge lamp, a filament lamp. The laser may further comprise any type of laser, such as, e.g., a solid state laser. The term pulsed source of radiation may thus be understood as any type of source which provides optical energy in a form of pulses, thus intermittently providing optical energy. The pulsed source of radiation, such as the laser LSR is controlled by a controller which in this example comprises a dose-sensor SENS which measures a dose of a pulse PLS of the source of radiation LSR. The dose sensor may comprise any type of optical sensor, such as, for example, but not limited to a photo diode, a photo resistive element, a photo conductive element. In general, the dose sensor may comprise any measurement device or measurement component which is configured to convert optical energy into a signal, such as, for example, an electrical signal, optical signal. The signal indicated here as a dose signal, which is thus representative of the measured dose, is provided by the dose sensor SENS at the dose sensor output DSO which may thus comprise, for example, an electrical output, optical output.

The controller further comprises an integrator unit I, an integrator input II of the integrator unit I being connected to the dose sensor output DSO. The integrator unit, which will be discussed in more detail below thus is able to integrate the dose signal provided by the dose sensor SENS at the dose sensor output DSO. An integrator output IO of the integrator unit I is provided to a driving input DRV of the source of radiation, thus in this example the laser LSR. In this example, a set point SETP is further provided, the set point being combined with the integrator output signal provided at the integrator output IO, before being provided to the driving input DRV of the source of radiation. In this example, the integrator output signal is subtracted from the set point, thus a difference between the setpoint SETP and the integrator output signal at the integrator output IO being provided to the driving input DRV of the source of radiation. The effect that the integrator output signal is in this example subtracted from the set point signal is because it is desirable to obtain a negative feed back in the control loop formed by the pulsed source of radiation (in this example the laser LSR) and the controller (in example comprising the dose sensor SENS and the integrator I). Instead of the subtraction to obtain a negative feed back other possibilities are that the integrator could, for example, have a negative gain. For schematic and explanatory purposes, the minus sign has however been incorporated in the combination between the set point and the integrator output.

As an alternative to the set point SETP shown in FIG. 3, it will be appreciated that the pulsed source of radiation may comprise a separate set point input to which the set point is connected and a separate modulation input which may serve as the driving input to which the integrator output signal may be connected. In accordance with an embodiment of the invention, the integrator unit integrates the dose signal at least twice, thus comprising, e.g., a double integrator. The integrator output IO thus provides an integrator output signal comprising an at least twice integrated dose signal. The inventors have devised that by providing that the integrator unit integrates the dose signal at least twice, a lower standard deviation of the output pulse PLS may be provided as compared to a conventional control system for the pulsed source of radiation which comprises a single integrator, thus an integrator unit comprising a single integrator. In particular, the inventors have devised that the standard deviation of the integrated dose at any point of the substrate when the pulsed source of radiation (such as the laser) is controlled by above described controller, may be expressed as:

$$SD\,(\text{output}) = \frac{SD\,(\text{laser})}{N\,(n/2)}$$

An explanation of the terms used in the formula having been provided above. One of the benefits of the controller according to this embodiment of the invention is that it lowers the standard deviation of the output of the laser pulses, thus providing for a more constant illumination of the substrate W or other object to be illuminated, at a given standard deviation of pulses of the laser LSR itself, a given number of pulses N in the slit and a number of pulses n in the slope at the edge Edg of the slit. A further benefit may be that a same amount of uniformity of illumination of the surface of the substrate or other object may be obtained with a lower pulse repetition rate of the pulsed source of radiation and/or with a higher scanning speed of the scanning of the substrate or other object. Thus, embodiments of the invention may, e.g., allow to enhance uniformity of illumination, to increase a scanning speed, thus increasing a throughput of the lithographic apparatus or other equipment in which the pulsed source of radiation and the controller is comprised, and/or to reduce cost, as given a certain amount of uniformity in illumination, a lower pulse repetition rate may be applied, thus making usage of a lower cost source of radiation possible (e.g., a lower cost laser having a lower pulse repetition frequency).

The controller, and in particular the integrator unit, may be implemented using analogue electronics, comprising, e.g., analogue integrators, multipliers, amplifiers, adders. However, it will be appreciated that the integrator unit may comprise digital electronics such as programmable integrated circuits, microprocessors, microcontrollers. The integrator unit may consist of hardware. However, it will be appreciated that the integrator unit at least in part may be implemented using software instructions to be executed by a microprocessor, microcontroller or other programmable device. In an embodiment of the invention, combinations of analogue and/or digital hardware and software are equally well possible. Further, as explained above, the dose sensor SENS may comprise any type of optical sensor. In addition, the dose sensor may also comprise suitable read out electronics, or other read out devices, such as, for example, a read out amplifier, a buffer, a sample and hold device, a pulse memory which stores a value representative of a pulse energy of a pulse. Also, the adding or subtracting function where the set point is added to the integrator output IO, as illustrated in FIG. 3, may be implemented using analogue and/or digital hardware, and may also be implemented at least in part in software.

FIG. 4a-4d each depict a schematic view of an embodiment of the integrator unit I as depicted and described with reference to FIG. 3. The integrator input II and integrator output IO as identified in FIG. 3, are also indicated in FIGS. 4a-4d. Thus, FIGS. 4a-4d each provide an example of a built up of the integrator unit I as depicted in FIG. 3. In addition to the elements of the exemplary embodiments as depicted and described with reference to FIGS. 4a-4d these embodiments may comprise further elements, structures such as, for example, amplifiers, adders, multipliers, integrators, dividers.

Figure 4A:
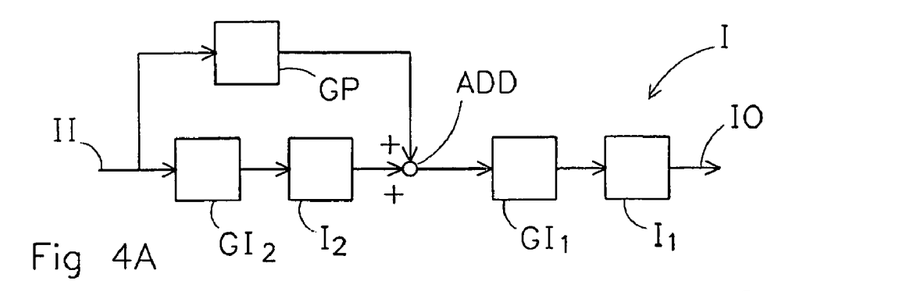
FIG. 4a-4e schematically depict details of (a part of) the controller as depicted in FIG. 3.

The embodiment of the integrator unit according to FIG. 4a comprises a first integrator stage I1 and a second integrator stage I2. A first amplifier GI1 is connected in series with the first integrator stage and a second amplifier GI2 is connected in series with the second integrator stage I2. Further, a bypass amplifier GP is provided which bypasses the second integrator stage I2 and the second amplifier stage GI2. An output signal of the bypass amplifier GP is added by an adder ADD to an output of the series connection of the second integrator stage I2 and the second amplifier stage GI2. The integrator stages I1 and I2 may each comprise a single integrator, thus each providing an integration. The integrator output signal IO in this example comprising a combination of a twice integrated dose signal as provided to the integrator input II, the twice integrated signal being provided by the series connection of the first and second integrator stages I1, I2 and the first and second amplifiers GI1, GI2. Further, the integrator output signal as provided at the integrator output IO may comprise a once integrated dose signal which is provided via a path comprising the bypass amplifier GP, the first integrator I1 and the first amplifier GI1. The amplifiers GI1, GI2 and GP may have any amplification factor. In an embodiment, the amplification may also be set to 0, and in that case the respective amplifier may be omitted. By selecting a gain for each of the amplifiers GI1, GI2 and GP, a mixture of once and twice integrated dose signals may be provided at the integrator output: when, for example, GP is set to zero, then the integrator output signal comprises a twice integrated dose signal only. In this example, GI1 and GI2 can be set to any, non zero value, a gain of these amplifiers influencing to gain of a control loop formed by the controller and the pulsed source of radiation as depicted in FIG. 3. When GI2 is set to zero, then only the path via GP and GI1 provides for an integrator output signal, the integrator output signal in that example comprising a once integrated dose signal.

Figure 4B:
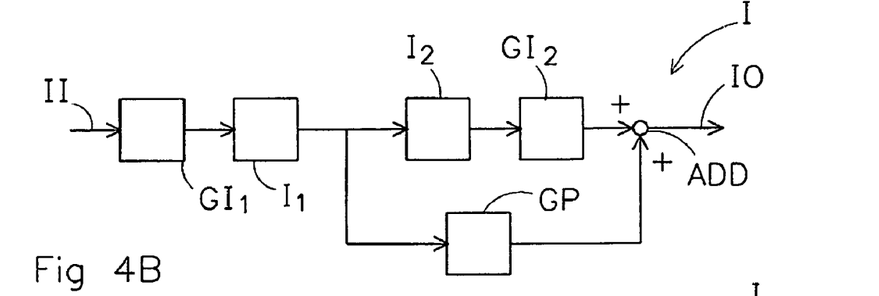
Figure 4C:
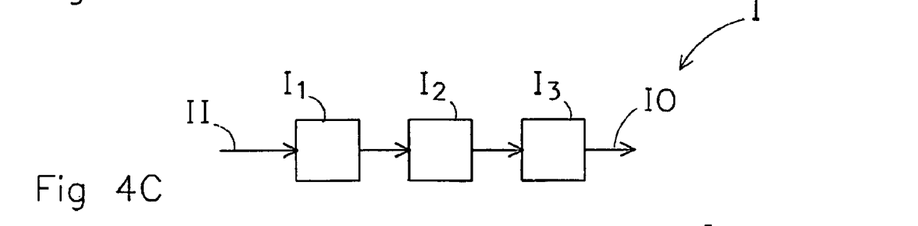
Figure 4D:
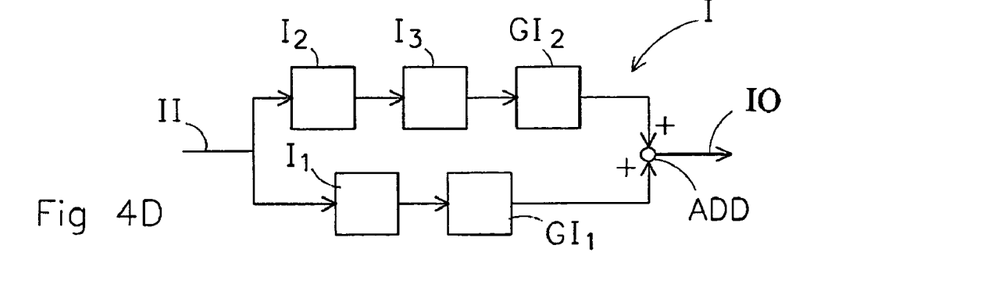

The implementation as shown in FIG. 4a as well as the implementations as shown in FIGS. 4b and 4d provide the benefit that by choosing appropriate gain factors for the respective amplifiers, the output signal provided at the integrator output may comprise the once integrated dose signal, the twice integrated dose signal and/or any combination thereof, which thus provide flexibility in the dimensioning of the controller to cope with specific requirements of the application in which the illumination system and/or controller are incorporated, the characteristics of the pulsed source of radiation (such as the laser, etc.) To further enhance flexibility, the amplifiers, or at least one of the amplifiers GI1, GI2, GP may comprise a programmable amplification factor. By the programmable amplification factor, a desired value for the amplification may be programmed into the respective amplifier, e.g., by a computer or microprocessor. To accomplish this, the amplifiers may be implemented fully or in part in software, which may enable to alter an amplification factor in a numeric way. Also, in an embodiment, the amplifiers comprise a plurality of amplification factors, e.g., using a resistive network comprising, e.g., a ladder network of resistors, and by selecting an appropriate one or appropriate ones of the resistors, e.g., by switches which may be operated by a control device, by a microcontroller, microprocessor. Also, the programmable amplifiers may comprise variable resistors (comprising, e.g., a field effect transistor, a potentio meter), the variable resistor being driven, for example, by a control device, microprocessor, microcontroller. A beneficial selection for the amplification factors may be obtained when the bypass amplifier GP comprises a gain of substantially 1, the second amplifier GI2 comprises a gain of substantially 1 and the first amplifier GI1 comprises a gain of substantially 0.5. This provides an adequate performance when a large number of pulses is in a slit, thus when a high amount of overlap between successive windows projected onto the substrate or other surface, is present. In particular, performance may be beneficial compared to a conventional controller when the number of pulses in the slope is larger than 2 (i.e., n>2), which may in general be accomplished when the number of pulses N in the slit is larger than 30. With a higher number of pulses, in particular with twice or more these values, the performance of the controller may show a significant improvement as compared to a conventional controller. By setting the amplification factor of the bypass amplifier GP to 1, the first amplifier GI1 to 1 and the second amplifier GI2 to 0, a single conventional integrator may be emulated. Thus, the embodiment as shown in FIG. 4a also makes it possible to revert back to the controller which has a single integrator by appropriate setting of the gain factors. In general, a beneficial range for the amplification factors of the amplifiers GI1, GI2, GP is in a range between 0 and 1.

FIG. 4b shows an alternative embodiment of the integrator unit I. The dose signal provided at the integrator input II is first integrated by the first integrator stage I1, an output of the first integrator stage I1 being provided to a second integrator stage I2 connected in series with an amplifier, in this example a second amplifier GI2. An amplifier GI1 may be connected in series with the first integrator stage I1, as shown in the embodiment of FIG. 4b. The second integrator stage I2 and the second amplifier GI2 are bypassed by bypass amplifier GP, thus the output of the first integrator stage I1 being also provided to an input of the amplifier GP. The output of the series connection of the second integrator stage I2 and the second amplifier GI2 is added to the output of the bypass amplifier GP by an adder ADD to provide the integrator output signal IO. With the exemplary embodiment as depicted in FIG. 4b, the integrator output signal at the integrator output IO may comprise a once integrated dose signal provided via the first integrator stage I2 and the amplifiers GI1, GP, and/or a twice integrated dose signal provided by the first and second integrator stages I1, I2 and the first and second amplifiers GI1, GI2. By choosing appropriate values for the amplification factors of the first and second amplifiers GI1, GI2 and the bypass amplifier, any combination of the once and twice integrated dose signal may be provided at the integrator output. Further, benefits as discussed with respect to the embodiment shown in FIG. 4a are, mutatis mutandis, also applicable to the embodiment shown and described with reference to FIG. 4b. The inventors have devised that a beneficial operation is obtained when selecting the am amplification of the bypass amplifier and of the second amplifier GI2 such as to be substantially 1, while an amplification of the first amplifier GI1 may be selected to be substantially 0.5.

FIG. 4c shows an embodiment comprising three integrator stages I1, I2, I3. The integrator stages I1, I2, I3 are in this example connected in series. An output signal at the integrator output IO thus comprises a triple integrator dose signal as provided to the integrator input II. The embodiment as shown in FIG. 4c may further comprise one or more amplifiers (e.g., connected in series with the series connection of integrators), one or more bypass amplifiers which bypass one or more of the integrator stages I1, I2, I3. Such controller has beneficial performance when, e.g., the profile as depicted and described with reference to FIG. 2b includes higher order profiles (e.g., parabolic curve-parts, including, e.g., 2nd order profiles) in addition to for example the trapezoid shape that consists of lower order (e.g., 0th and 1st order) profiles only.

FIG. 4d shows a still further embodiment of the integrator unit I. The embodiment shown in FIG. 4d comprises a parallel connection of two branches. A first branch comprises a first integrator stage I1 and a first amplifier GI1, a second branch comprising a second integrator stage I2 and the third integrator I3 and a second amplifier GI2. Both the first and second branch is provided with the dose signal provided at the integrator input. Outputs of the branches are added by the adder ADD. The first branch provides by the first integrator stage I1 and the first amplifier GI1, a once integrated dose signal to the integrator output IO. The second branch provides via the second integrator stage I2 and the third integrator stage I3 as well as the second amplifier GI2 a twice-integrated dose signal to the integrator output IO. As explained above with reference to FIGS. 4a and 4b, by choosing appropriate amplification factors for the first and second amplifiers GI1, GI2, a desired combination of a once integrated dose signal and a twice integrated dose signal may be provided at the integrator output IO. Due to the slightly different architecture of the embodiment shown in FIGS. 4b and 4d, amplification factor might differ somewhat from the amplification factors as described with reference to FIG. 4a.

Figure 4E:
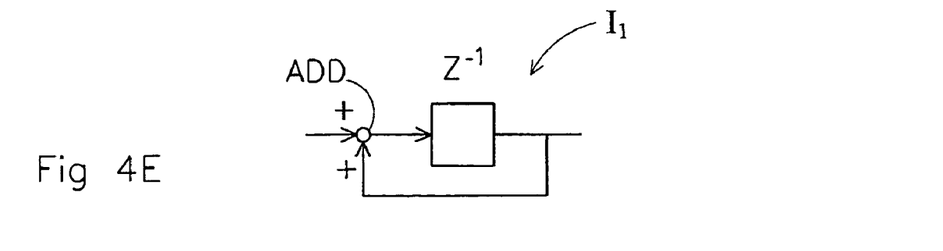

FIG. 4e schematically depicts an implementation of an integrator stage, in this example the integrator I3 as depicted in FIGS. 4a-4d may however be identical. The embodiment as shown in FIG. 4e comprises a delay, here indicated as $z^{-1}$, the delay being substantially equal to a time between successive pulses of the pulsed source of radiation. An output of the delay $z^{-1}$ is provided to an output of the integrator stage and fed back to an input thereof. At the input, an input signal to the integrator stage is added by an adder ADD to the output signal of the unit delay $z^{-1}$ and provided as input to the unit delay. In particular, in a digital or numeric implementation, the integrator of FIG. 4e may be implemented, e.g., in software or dedicated hardware, thus making analogue implementations (requiring, e.g., large capacitors, high precision, low leakage electronics, etc.) superfluous.

In addition to the elements of the integrator unit has depicted in the exemplary embodiments according to FIGS. 4a-4d, the controller may further comprise an amplifier having a amplification factor which may be substantially an inverse of or less than an inverse of an amplification factor of the source of radiation in case that the dose sensor performs a (substantially) calibrated measurement. Thereby, an optimum loop amplification factor in a control loop consisting of the pulse source of radiation LSR, the dose sensor sense, and the integrator I as depicted in FIG. 3, may be obtained. The amplifier may be connected in series with the embodiments shown in FIGS. 4a-4d thus, e.g., directly at the integrator input II or the integrator output IO. To obtain a high stability in the control loop, it is preferred that the amplification factor of the amplifier is less than the inverse of the amplification factor of the source of radiation.

As in a further embodiment of the invention, it is possible in any of the embodiments of the integrator unit, such as the embodiments depicted and described with reference to FIGS. 4a-4d, that at least one of the integrator stages comprises a leaking integrator stage, to prevent a wind up or saturation in case of a, e.g., an input to the integrator having a high value or a input which lasts for more than average time, thus leading to a high value at the output of the integrator stages(s). The controller as described here may be used in an illumination system of a lithographic apparatus, however may have numerous other embodiments. In an embodiment, the controller may be used in any illumination system which comprises a pulsed source of radiation.

According to an embodiment of the invention, there is provided a method including measuring a dose of a pulse PLS of the source of radiation LSR, at least twice integrating the measured dose to provide an integrated output signal comprising an at least twice integrated dose signal, and driving a driving input DRV of the source of radiation LSR with the integrated output signal.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV)

radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam, the illumination system comprising a pulsed source of radiation and a controller to control an output of the pulsed source of radiation, the controller comprising:
   (a) a dose sensor configured to measure a dose of a pulse of the pulsed source of radiation and to provide a dose signal representative of the measured dose; and
   (b) an integrator unit configured to at least twice integrate the dose signal, an output of the integrator unit to provide an integrator output signal comprising the at least twice integrated dose signal, the output of the integrator unit to drive a driving input of the source of radiation with the integrator output signal.

2. The lithographic apparatus according to claim 1, wherein the integrator output signal further comprises a once integrated dose signal.

3. The lithographic apparatus according to claim 2, wherein the integrator unit comprises a first integrator stage to integrate the dose signal and a second integrator stage to provide the twice integrated dose signal, and amplifiers to amplify the once and twice integrated dose signals.

4. The lithographic apparatus according to claim 3, wherein the amplifiers comprise a programmable amplification factor.

5. The lithographic apparatus according to claim 3, wherein the integrator unit comprises a series connection of the two integrator stages and two of the amplifiers, the integrator unit further comprising a bypass amplifier to bypass a first of the integrator stages and a first of the amplifiers.

6. The lithographic apparatus according to claim 5, wherein the bypass amplifier comprises an amplification factor of substantially 1, wherein the bypassed of the two of the amplifiers in the series connection comprises an amplification factor of substantially 1 and wherein the other of the two of the amplifiers in the series connection comprises an amplification factor of substantially 0.5.

7. The lithographic apparatus according to claim 3, wherein the integrator unit comprises a series connection of the two integrator stages, a first of the amplifiers to amplify a once integrated dose signal from an output of the first of the integrator stages, and a second of the amplifiers to amplify the twice integrated dose signal from an output of the second of the integrator stages.

8. The lithographic apparatus according to claim 1, wherein the controller further comprises an amplifier having an amplification factor which is substantially an inverse of an amplification factor of the source of radiation.

9. The lithographic apparatus according to claim 1, wherein the controller further comprises an amplifier having an amplification factor which is substantially less than an inverse of an amplification factor of the source of radiation.

10. The lithographic apparatus according to claim 1, wherein the integrator unit comprises at least one leaking integrator stage.

11. The lithographic apparatus according to claim 1, wherein the integrator unit comprises first and second integrator stages configured to twice integrate the dose signal and further comprises a third integrator stage, the third integrator stage configured to integrate the twice integrated dose signal to provide a triple integrated dose signal, the integrator output signal at the integrator output to comprise the triple integrated dose signal.

12. An illumination system configured to condition a radiation beam, the illumination system comprising a pulsed source of radiation and a controller to control an output of the pulsed source of radiation, the controller comprising:
   a dose sensor configured to measure a dose of a pulse of the pulsed source of radiation and to provide a dose signal representative of the measured dose; and
   an integrator unit configured to at least twice integrate the dose signal, an output of the integrator unit to provide an integrator output signal comprising the at least twice integrated dose signal, the output of the integrator unit to drive a driving input of the source of radiation with the integrator output signal.

13. A controller to control an output of a pulsed source of radiation, the controller comprising:
   a dose sensor configured to measure a dose of a pulse of the pulsed source of radiation and to provide a dose signal representative of the measured dose; and
   an integrator unit configured to at least twice integrate the dose signal, an output of the integrator unit to provide an integrator output signal comprising the at least twice integrated dose signal, the output of the integrator unit to drive a driving input of the source of radiation with the integrator output signal.

14. A method of controlling an output of a pulsed source of radiation, the method comprising:
   measuring a dose of a pulse of the pulsed source of radiation;
   at least twice integrating the measured dose to provide an integrator output signal comprising an at least twice integrated dose signal; and
   controlling the pulsed source of radiation with the integrator output signal.

15. A lithographic apparatus comprising:
   a pulsed source of radiation configured to output a beam of radiation;
   a controller configured to control an output of the pulsed source of radiation, the controller comprising:
   (a) a dose sensor configured to measure a dose of a pulse of the pulsed source of radiation and to provide a dose signal representative of the measured dose, and
   (b) an integrator unit configured to at least twice integrate the dose signal, an output of the integrator unit to provide an integrator output signal comprising the at least twice integrated dose signal, the output of the integrator unit to drive a driving input of the source of radiation with the integrator output signal;

an illumination system configured to condition the beam of radiation;

a support configured to support a patterning device, the patterning device configured to pattern the beam of radiation to provide a patterned beam of radiation, and a projection system configured to project the patterned beam of radiation onto a surface of a substrate.

* * * * *